United States Patent [19]

Ouderkirk et al.

[11] Patent Number: 5,061,604

[45] Date of Patent: Oct. 29, 1991

[54] NEGATIVE CRYSTALLINE PHOTORESISTS FOR UV PHOTOIMAGING

[75] Inventors: Andrew J. Ouderkirk, Woodbury; Douglas S. Dunn, Maplewood, both of Minn.

[73] Assignee: Minnesota Mining and Manufacturing Company, St. Paul, Minn.

[21] Appl. No.: 518,880

[22] Filed: May 4, 1990

[51] Int. Cl.$^5$ .................................................. G03F 7/36
[52] U.S. Cl. ...................................... 430/296; 430/313; 430/323; 430/325
[58] Field of Search ................ 430/296, 313, 323, 325

[56] References Cited

U.S. PATENT DOCUMENTS

| | | | |
|---|---|---|---|
| 4,307,178 | 12/1981 | Kaplan et al. | 430/296 |
| 4,389,482 | 6/1983 | Bargon et al. | 430/325 |
| 4,414,059 | 11/1983 | Blum et al. | 156/659 |
| 4,458,994 | 7/1984 | Jain et al. | 354/4 |
| 4,588,801 | 5/1986 | Harrah et al. | 528/33 |
| 4,613,398 | 9/1986 | Chiong et al. | 430/313 |
| 4,822,451 | 4/1989 | Ouderkirk et al. | 156/643 |
| 4,824,699 | 4/1989 | Woo et al. | 427/307 |
| 4,868,006 | 9/1989 | Yorkgitis et al. | 427/53.1 |
| 4,879,176 | 11/1989 | Ouderkirk et al. | 428/323 |

FOREIGN PATENT DOCUMENTS 0184567 6/1985 European Pat. Off. .

Primary Examiner—Charles L. Bowers, Jr.
Assistant Examiner—Janet C. Baxter
Attorney, Agent, or Firm—Gary L. Griswold; Walter N. Kirn; Mark A. Litman

[57] ABSTRACT

A described photo-sensitive system and process is useful as negative single layer photoresists with high resolution, high contrast, high sensitivity, long shelf life, and insensitivity to ambient light and allows large flexibility in the choice of polymer to be used.

17 Claims, No Drawings

NEGATIVE CRYSTALLINE PHOTORESISTS FOR UV PHOTOIMAGING

BACKGROUND OF THE INVENTION

There are a number of polymer resist systems for photolithography. The most common system is a single layer of a sensitive resist material coated on a substrate which is exposed to patterned radiation (e.g., electromagnetic radiation such as light, E-beam, X-ray), developed in a solvent and then used in a further process, for example as an etchant barrier. This traditional system, which can be either positive or negative acting, has many shortcomings in the low micron and sub-micron image definition range. A major problem faced is achieving fine resolution along with line-width control, particularly on reflective substrates. Resolution is limited by resist contrast as well as optical imaging resolution. Poor resist contrast results from linear effects of light intensity on the photochemical process in the resist material. Another problem is that the developer acts isotropically and produces sloped sides and poor reproduction of the mask pattern (e.g., undercutting or grading). Developing solvents are expensive, often toxic, and introduce defects.

Multi-layered resist systems have been designed to overcome many of the single layer process problems, and although good line-width control is achieved, these systems are highly complex and not amenable to a wide variety of production settings.

Single-layered dry process resist systems are available such as described in U.S. Pat. Nos. 4,307,178 and 4,389,482 which use plasma etching and reactive ion etching to develop the resist. These systems have poor contrast and allow loss of resist during development.

"Self developing" photoresist systems are single layer polymers which photo-decompose, volatilize and vaporize when exposed to U.V. light. U.S. Pat. No.4,588,801 discloses the use of polysilanes in this type of system. The use of nitrocellulose as a self-developing resist is discussed in *Self-developing Resist With Submicrometer Resolution and Processing Stability*, Gies et al, Appl. Phys. Letts., 43, p. 74, July 1983 and describes that high aspect ratio lines are achievable. These systems have high photochemical quantum yields and are capable of high resolution, but require high pulse power and high U.V. exposure. They also create debris which is left on the surface.

U.S. Pat. No. 4,458,994 teaches the use of an excimer laser as the radiation source in optical lithography, giving finer pattern resolution in short exposure times using conventional resists.

U.S. Pat. No. 4,414,059 teaches the use of an excimer laser in a one step process to pattern a layer of resist by ablative photodecomposition using U.V. radiation at power densities sufficient to cause fragmentation of the resist polymer chains.

EP 248,779 is an application for a single layer dry development positive resist system. It teaches coating a substrate with a polymer admixed with a photosensitive cross-linking agent, exposing the coated substrate through a mask to U.V. light, treating the layer with a silicon compound and plasma etching to remove the irradiated areas to form the desired positive pattern.

EP 184,567 is an application for the recently announced "Desire" process which is a single layer dry development negative resist system. The coated polymer resist, when imaged with standard U.V. light, chemically reacts with silicon containing compounds where exposed. The imaged polymer is then developed with an oxygen plasma. The silylated areas form protective oxides on the surface that stop further etching, thus leaving these areas to form an image. This system is severely limited by the resist material that can be used because of the nature of the U.V. exposure changing the chemical activity of the resist so it selectively absorbs silicon compounds which then become an oxygen plasma barrier during the developing stage.

U.S. Pat. Nos. 4,868,006, 4,879,176 and 4,822,451 disclose the formation of quasi-amorphous regions on semicrystalline polymer surfaces by pulsed energy treatment. A positive resist film is shown in one example of the last patent.

SUMMARY OF THE INVENTION

The present invention is a unique negative acting photosensitive system comprising a semicrystalline polymer layer on a substrate, which layer is imaged with pulsed radiation (e.g. though a mask) and further developed in a selected solvent. The latent image can be converted to a relief pattern by ion etching or U.V. flooding followed by solvent development. This leaves on the substrate the exposed semicrystalline polymer which is then a defining layer on the substrate. Said defining layer is useful as an etchant barrier or a coating barrier in photoresist systems.

DETAILED DESCRIPTION OF THE INVENTION

The present invention provides unique photoresist systems utilizing imaged irradiated areas in a semi-crystalline polymer layer, formed by the irradiation of the polymer by radiation which is strongly absorbed by the polymer and of sufficient intensity and fluence to cause an amorphized or quasi-amorphized area.

It has been found that there are significant differences in activity to solvents between the semi-crystalline portions and the amorphous or quasi-amorphous portions of the above so treated polymers, and that by proper utilization of these differences, common polymers can be effectively used as new, novel, inexpensive, and easy to use photoresist layers. The photoresists are single layer, and of high resolution, high contrast, high sensitivity, provide large flexibility in the choice of the polymer used, have long shelf life, and are insensitive to ambient light.

Conventional carbon based wet processed polymer photoresists are large molecules in the form of long chains, the irradiation of which causes crosslinking, bond scission, or photochemical reaction depending on the system used. In a negative system the resist molecules are relatively small and are made larger upon radiation by crosslinking and in a positive system the molecules are relatively large and undergo bond scission and are thus made smaller. In the case of bond scission or crosslinking, development of the image takes place because the lower molecular weight (or shorter) portions are more soluble in the developing solvent. Photochemically modified resists have altered chemical functionality in the exposed areas, which changes the solubility in the developing solvent.

Dry processed systems use polymers as the resist coatings and use a radiation ablative development step which tends to leave debris on the surface which interferes with further processing and limits the obtainable resolution.

In the present invention, the resist semi-crystalline polymer is made quasi-amorphous by the action of a controlled and patterned exposure with an excimer laser, thus producing a latent image in the polymer layer. The quasi-amorphous regions produced are totally free of the polymeric decomposition debris which results from the radiation ablative processes described above.

The quasi-amorphous surface layer or areas produced according to the practice of the present invention are generally and preferably substantially, essentially, or even totally free of polymeric decomposition debris which typically results from ablative processes as described in U.S. Pat. No. 4,417,948 and the articles of Srinivasan et al noted above.

Even if not visually observable in the amounts present, the debris itself would be yellower in color than the bulk material and would be more highly conjugated. The debris also tends to leave microscopically observable (at least 10,000X, preferably 20,000X) artifacts on the surface.

The terms amorphous, crystalline, semicrystalline, and orientation are commonly used in the description of polymeric materials. The true amorphous state is considered to be a randomly tangled mass of polymer chains. The X-ray diffraction pattern of an amorphous polymer is a diffuse halo indicative of no ordering of the polymer structure. Amorphous polymers show softening behavior at the glass transition temperature, but no true melt or first order transition.

The semicrystalline state of polymers is one in which long segments of the polymer chains appear in both amorphous and crystalline states or phases. The crystalline phase comprises multiple lattices in which the polymer chain assumes a conformation in which there is a highly ordered registry in adjacent chemical moieties of which the chain is constructed. The packing arrangement (short order orientation) within the lattice is highly regular in both its chemical and geometric aspects. Semicrystalline polymers show characteristic melting points, above which the crystalline lattices become disordered and rapidly lose their identity. The X-ray diffraction pattern of semicrystalline polymers (or copolymers) generally is distinguished by either concentric rings or a symmetrical array of spots, which are indicative of the nature of the crystalline order.

Orientation of the polymer is the directional alignment of the polymer chain (long-range order) or segments of the polymer (chain) within the polymer composition. In the quasi-amorphous state described in the practice of the present invention, it appears that the overall long-range order orientation or ordering of the crystal lattice remains in an apparent crystalline orientation. It also appears that there is, however, significant localized disordering along the chain (short-range order orientation). The quasi-amorphous form thus exhibits short order non-orientation or low orientation typical of amorphous phases while it exhibits long-range ordering typical of crystalline structures. These characteristics are observable and determinable by single analytic techniques or combinations of techniques such as X-ray diffractions, spectromicrophotometry, infrared reflection absorption spectroscopy (IRRAS), NMR, solvent extraction, and the like.

The surface of the semicrystalline polymer is converted into its quasi-amorphous form by heating and rapid cooling of a determined amount of that surface. A determinable depth of the polymer composition is converted to the quasi-amorphous state. The conversion is referred to as "amorphizing." The thickness of the amorphized layer in the polymer, as measured from the surface downward into the bulk of the polymer, can be controlled. The polymer usually has a quasi-amorphous top surface having a depth of at least 5 nm, preferably at least 10 nm, more preferably at least 40 nm and most preferably at least 60 nm. The range of thickness for the quasi-amorphous phase or surface of the polymer may be from about 5 to 10,000 nm, preferably 10 to 1,000 nm, more preferably 20 to 500 nm or 20 to 100 nm and most preferably 20 to 250 nm, depending upon the ultimate use of the article.

The surface quasi-amorphous layer is firmly adhered to the bulk of the semicrystalline polymer because of the in situ nature of the conversion. There can even be a discernible gradation zone between the quasi-amorphous and semicrystalline areas, although this is not always the case. That is, the transition can be very abrupt within the polymer.

In performing the process of making the quasi-amorphous surfaces of the present invention, the wavelength of the light or ultraviolet radiation and/or the polymer and/or absorbing dye in the polymer should be chosen so that the polymer composition exhibits an absorption constant greater than about 1 per micrometer. The higher the absorption constant for any given wavelength, the thinner is the surface layer which resides in the optical path of the radiation, and correspondingly, the thinner is the surface layer which undergoes a morphological transition or "amorphization". The wavelength range of preferred interest is between about 180 and 360 nm, with the highest absorption constant generally being manifested at the shorter wavelengths. Preferably an absorption constant of at least 2 per micrometer is exhibited by the polymer at the wavelength of irradiation.

When utilizing ultraviolet radiation (e.g., 193 nm), it is desired that the polyester film receives energy corresponding to a fluence of 3–25 mJ/cm$^2$/pulse. At fluences of less than 3 mJ/cm$^2$/pulse, the effect of the radiation is not readily discerned. At fluences greater than 25 mJ/cm$^2$/pulse, one begins to encounter excessive damage to the affected surface layer, such as vaporization (e.g., off-gassing) of low molecular weight products of photodegradation, substantial reduction of the molecular weight of the surface layer, and more extensive surface roughening.

The radiation pulse duration, i.e., the pulse width, should be in the range of 10 nanoseconds to 100 microseconds to assure rapid excitation of the affected surface layer. The sensitivity of the polymer is increased by heating the polymer during irradiation. This temperature should be below the $T_m$ for the polymer.

The net effects of pulse width, absorption constant, and radiation intensity are to produce a particular type of mechanistic events. First, and to a minor degree, there is a photolytic effect in which absorbed radiation energy causes random bond scission to occur in the semicrystalline polymer.

The second effect is a result of the unusual nature of the thermal excitation of the surface layer in the optical path of the radiation. Much of the absorbed light energy is translated into heat, with the heating cycle corresponding to the pulse width of the radiation. It is certain that instantaneous temperatures that exceed the normal melting point of the polymer (e.g., for poly(ethylene terephthalate) that is about 260° C.) are reached throughout most of the affected volume, although an unusual thermal gradient may be produced within that volume because of the rapid attenuation of the incident energy due to light extinction by the polymer composition. The heat cycle thus corresponds to the pulse width, in a range of from about 10 nanoseconds to 100 microseconds. After the heating cycle, the next phenomic concern is the ensuing cooling cycle. Because of the thin nature of the affected volume and its contact with bulk material (which are usually at room temperature), it can be estimated that the surface probably cools down to the glass transition temperature (e.g., for poly(ethylene terephthalate) this is about 75° C.) within microseconds. Once below this temperature, polymer chain conformations tend to be frozen. Considerations with respect to this unusually brief thermal cycle indicate that conformational changes available to the polymer chains remain highly restricted during the brief period while the affected surface area undergoes this excitation. Short segmental motions, e.g., of the 'crankshaft' rotational type, have extremely short relaxation times, and it is expected that they may readily occur within the time-temperature regime created in the practice of the process of the present invention. The confirmation that such motions do indeed occur is provided by the IRRAS spectroscopic studies that show that there is a significant trans-to-gauche-conformer transformation in the surface layer which results from the irradiation of semicrystalline film (e.g., biaxially oriented poly(ethylene terephthalate)) with an ArF excimer laser.

This type of conformational change requires the rotation of a short segment of the PET chain involving only a few carbon or oxygen atoms. Similar considerations indicate that it is highly unlikely that the pre-existing crystallites or crystal lattices in the affected surface layer undergo any major spatial rearrangements because this time-temperature regime precludes the type of long range translational and large chain segment rotational motions which would materially change the pre-existing packing arrangement within the crystal lattice. Thus, it strongly appears that the pulsed UV irradiation of PET (and probably all semicrystalline polymers having appropriate extinction coefficients) provides films having surface layers with a unique morphology (i.e., quasi-amorphous) in which the polymer chains are highly disordered over short segment lengths, but substantially retain the long-range order that existed between chains and over long segment lengths of those chains prior to excitation. Indeed, the laser treatment of a thin film of thermally crystallized PET indicated that the original spherulitic structure remained intact, tending to affirm this description.

The substantial trans-to-gauche-conformer transformation which is caused by excimer laser excitation is a clear indication of short range chain conformation disordering, suggesting that although the crystallites may have undergone short range disordering, the longer range 3-dimensional packing order probably remains virtually intact. It is for this reason that the surface is referred to as quasi-amorphous since it has some physical characteristics of crystalline material, and yet displays predominantly amorphous properties.

The volume of polymer affected or converted (i.e., the affected surface layer or areas) by the process of the present invention is defined as being in a 'quasi-ampor-phous' state because the highly ordered registry of identical chemical moieties in adjacent folds of the chain-folded crystal lattice is largely destroyed, but the overall 3-dimensional architecture of the crystal lattice is preserved. Thus, the chemical disordering which occurs as a result of the radiation is characteristic of an amorphous state, while the retention of longer range geometric order resembles a pseudo-crystalline state. The layers or regions are neither totally amorphous nor totally crystalline in the classic sense of those words. In this specification where quasi-amorphous layers or regions produced in the practice of the present invention are discussed, those regions may be referred to as quasi-amorphous layers or regions because their chemical properties tend to resemble amorphous compositions rather than crystalline compositions, but amorphous and quasi-amorphous are distinctly different as noted in the description of quasi-amorphous materials given above.

Quasi-amorphous is a state which is between semicrystalline and amorphous. It is more difficult to distinguish from a true amorphous state than a semicrystalline state, but a clear distinction can be drawn.

The quasi-amorphous layer must, of course, be formed from a semicrystalline state. The semicrystalline state may be a uniaxially oriented film, biaxially oriented film, or contain grossly unoriented crystallites (e.g., spherulitic crystallites randomly distributed throughout the film). When such a semicrystalline film is converted by the process of this invention (in whole or in part, as on one surface only) to the quasi-amorphous form, the quasi-amorphous areas will appear to be amorphous except that they will retain a latent memory for the crystalline orientation. This is a definitive distinction from the true amorphous state.

For example, oriented film will display anisotropy with respect to the absorption of infrared radiation (e.g. between 5,000 and 16,000 nm) in various directions in the film. Biaxially oriented film would most significantly display this anisotropy between the unoriented thickness dimension (e.g., the z-axis) and the oriented length and width dimensions (e.g., the x- and y-axes) of the film. When an oriented film is quasi-amorphized according to the present invention to a state most closely resembling a true amorphous film (e.g., the entire thickness or a larger thickness is repeatedly treated without ablation of the film is quasi-amorphous), the film or layer will appear to be amorphous. However, the film or layer will not be truly amorphous because it will retain a latent memory for the crystallite orientation, in this case being evidenced by a latent memory for the anisotropic orientation of the original semicrystalline polymer.

When this quasi-amorphous layer or film is heated to promote recrystallization, the film or layer will begin to regain its original crystallite distribution or in the case of oriented film, regain at least part of its anisotropic orientation. When a truly amorphous layer is heated, it will not develop anisotropy. Where the semicrystalline polymer film originally contained grossly unoriented crystallites, reheating of the quasi-amorphous layer or film would return such a crystallite orientation to the layer or film.

The process appears to work by the semicrystalline polymer's absorbing the energy of the irradiation within a limited depth of the irradiated surface. The energy is of sufficient intensity and duration to melt polymer, but of insufficient intensity and duration to evaporate, significantly chemically modify, or ablate polymer. When the irradiation stops, the melted polymer rapidly cools without recrystallization. No special cooling of the melted layer usually needs to be performed as the melted layer is usually sufficiently thin that ambient air and adjacent bulk polymer temperatures will cool it sufficiently rapidly.

Rapid cooling may be required for high image resolution, to prevent recrystallization, and minimize polymer thermolysis.

The semicrystalline polymer should be able to absorb the irradiation used in the process. The more highly absorptive the polymer is of the radiation, the greater the concentration of the process to the surface of the polymer. In general, the polymer should be able to absorb sufficient energy to cause thermal softening or melting of the surface and yet not absorb radiation at such a high level as would cause ablation, excessive degradation, or volatilization of the polymer. For example, a polymer may absorb at least 5% of incident radiation in a 1 micron thick film when the radiation is applied at a rate of 1 Joule/cm$^2$. Absorption of the radiation may be enhanced by the addition of radiation absorbing dyes and pigments to the polymer. These, and other, radiation absorbing materials can have some noticeable effect at levels as low as 0.5% by weight, but can also be used higher levels, even up to 90% by weight and higher. For example, a polymer used to modify a pigment may be treated after it has been combined with the pigment. A generally preferred range would be from 0.1 to 50% by weight for such radiation absorbing additives.

The process of the present invention also tends to not modify the surface of the polymer in a topographic morphologic sense. The surface structure, before and after amorphizing, tends to be the same in the practice of the present invention. Surfaces with a high degree of surface roughness may be somewhat softened in their features, but will still tend to have rough surfaces. Smooth surfaces will be substantially unchanged with respect to the absence of features on their surface.

There are two necessary conditions required of the radiation source to provide the treatment of the present invention. Both high intensity (high power per unit area) and high fluence (high energy density per pulse) are required of the radiation source. These requirements assure that a substantial amount of heat generated in the very thin surface of treatment stays in the surface. The effect of the radiation is to concentrate energy into the surface layer. Thermal diffusion into the bulk reduces this concentration of energy and makes the process less efficient. It is, therefore, desirable that only a small amount of heat be dissipated into the bulk of the polymer during irradiation. The more heat that is transferred to the bulk during the surface irradiation, the less efficient the process becomes until so much heat goes to the bulk that the process no longer works. Because of this requirement to rapidly heat only the surface layer and not the bulk of the polymer, conventional high intensity UV sources such as mercury arc lamps and common Xenon flash lamps with their inherently long pulse widths result in rapid diffusion of the thermal energy into the bulk polymer. This prevents a high concentration of energy being achieved at the surface.

The UV excimer laser is capable of producing high intensity, high fluence radiation on the surface of the polymer to be treated. The polymer used with a UV excimer laser must be semicrystalline and UV absorbing at the UV laser wavelengths. The result of the laser pulse interacting with the surface is a combination of photolyzation and heating. In other words, the short intense pulse significantly heats the surface of the polymer, but not the bulk, above the polymer melting temperature, and some surface molecule chain scission occurs. During the brief time the surface region is heated above its melting temperature, the molecules can randomize themselves into a disordered condition and broken bonds reconnect, although not necessarily to the same end from which they were broken or to the same degree. The temporarily broken molecular bonds may assist this melting process. After irradiation the surface layer will rapidly cool, and "freeze" the new disordered layer into a quasi-amorphous structure. That is, the cooling rate is fast enough so the surface layer cannot recrystallize. The irradiation thus produces a quasi-amorphous layer on the bulk polymer which layer undergoes only a small change in molecular weight because of the recombination of bond scissions and no chemical changes such as the addition of ions. The surface texture undergoes no significant change because no material has been removed or ablated and both melting and cooling occur over a short period of time.

The laser treated surface can be shown to be quasi-amorphous by a number of tests: (1) it washes off with solvents that only the amorphous form of the polymer is soluble in, (2) infrared reflection absorption spectroscopy (IRRAS) of the surface indicates the same pattern in the surface layer as is normally exhibited by the amorphous form of the polymer, and (3) thin film ellipsometry of the surface gives the same refractive index as does the amorphous form of the polymer.

As viewed at 32,000X magnification, slight texturing on an extremely fine scale is observed, with no features greater than 700 Angstroms or 600 Angstroms in height, and most (more than 50%) of all features having a height of less than 300 Angstroms. Shadow mask Transmission Electron Microscopy (TEM) indicates peaks and valleys on the surface of about 300 Å. In still other cases, similar treated PET film displays completely smooth, essentially featureless surfaces.

Early investigations of laser treatments of polymers were concerned with etching or ablation of the polymer and thus used laser intensities and fluences much higher than required for the present invention. These investigators found a fluence threshold for ablation which of course was different for each polymer treated. Below this threshold no ablation would take place. Investigation was never made to determine what actually was occuring at lower fluences. It has been found that like the fluence threshold for ablation, there is likewise a fluence threshold for the amorphization of this invention and it too varies with the polymer being treated.

Because of its great commercial interest, the treatment of PET has been studied most extensively during the progress of the present invention. However, other polymers have also been studied. The following semicrystalline, UV absorbing polymers or copolymers thereof have been treated: polyesters (e.g., PET), nylon, coating mixtures of poly(vinylidene chloride) on PET and poly(vinyl chloride) with UV absorbing plasticizer added, polyimides (as liquid crystalline polymers). Polypropylene, polyethylene (e.g., polyolefins), polyvinyl chloride, polytetrafluoroethylene and polyvinylidene chloride, although semicrystalline, are not UV absorbing at wavelengths greater than 190 nm, and therefore, require one of the following: the addition of UV absorbing compounds, shorter wavelength lasers, or an energy source different than a UV laser. E-beam, x-rays, ion beams, and plasmas, if applied in sufficient intensity and fluence can work on these polymers.

Polymethylmethacrylate and epoxies are normally amorphous and so treatment does not effect a differentiation between the surface and bulk polymer.

The UV radiation source can be by excimer laser or flashlamps at wavelengths less than 320nm. The pulse widths should be less than 100 microseconds. Typical pulse widths are 7.5 microseconds for flash lamps and 10–80 nanoseconds for an excimer laser.

The unique discovery of the present invention was the finding that pulsed UV light could be used to create high resolution quasi-amorphous latent images in semi-crystalline polymers, and that the quasi-amorphous polymer has an effectively discriminating and different solvent activity than the semi-crystalline polymer. Therefore the latent polymer images can be developed producing photoresist images. The quasi-amorphous polymer, for example, will selectively absorb solutes such as silanes, siloxanes, salts, and organometallics. These solutes are selected for each polymer resist system. The patterned resist is then further developed by ion etching wherein the absorbed solute becomes a barrier to the etching process and the semi-crystalline non-irradiated areas of the polymer are etched away.

When dyes, conjugated and aromatic hydrocarbons or other U.V. absorbing materials are used for the selectively absorbed solute, the latent imaged polymer is next flooded with U.V. light and then further developed with a solvent which selectively dissolves the portion of the polymer unprotected by the aforementioned selectively absorbed solute.

Photoresists based on quasi-amorphization of the polymer substrate have several inherent advantages to standard resist techniques. They are:
1) Higher contrast. Melting a polymer has an energy density threshold, creating a high contrast system.
2) Light stable. Moderate intensity light has no effect on either the unexposed resist or the latent image.
3) High sensitivity. Typical exposures are a factor of 2–3 less than other resists.
4) Broad range of resist chemistry.
5) High resolution. Single layer resist system that is capable of sub-micron resolution.
6) Simple, one layer resist system.
7) Does not require an antireflection layer.

EXAMPLES

In the following examples all irradiations were done using a Model 102E laser by Lambda Physik of Acton, Mass. with a system of cylindrical lens to control the exposed area of the sample and thus the energy density of the beam striking the sample. The system was calibrated using a Model ED500 power meter by Gentech, Ste-Fog, Qc, Canada. Pulse width was approximately 15 nanoseconds.

All spin coating was done using a model 1-EC101D-R485 spin coater from Headway Research Inc., Texas. All reactive ion etching was done using a a Randex Model 2400 reacitive ion etcher from Perkin Elmer Co., Eden Prairie, Minn.

The photo mask was a 1 um feature size chrome on quartz mask from Tektronix, Beaverton, Oreg.

EXAMPLE 1

A silicon wafer was coated with 160 nm of polyethylene terephthalate (PET) from a solution of six g. of 28000 MW PET in 200 g. of ortho-chlorophenol. The sample of PET was crystallized in a vacuum oven at 200° C. for 1 hour. The PET coated wafer was imaged to two pulses of 248 nm light from a KrF excimer laser at an energy density of 20 mJ/cm$^2$/pulse. The light was imaged with a 1 um feature size chrome on quartz mask. The wafer was flooded with A-187 organosilane ester from Union Carbide, New York, and immediately spun at 2500 rpm. While spinning, the wafer was washed with ethanol to remove excess silane. The wafer was etched in a oxygen reactive ion etcher with a forward RF power of 190 watts for 4 min. The etching fully removed the areas that were unexposed by the excimer laser, and left the silane infiltrated amorphous areas intact.

EXAMPLE 2

A silicon wafer was coated with 0.4 um of Pyralin TM (E. I. DuPont) from a solution of 10 ml Pyralin TM 2545 polyimide, 10 ml ethyl acetate, and 10 ml N-methyl pyrrolidone. The wafer was flooded with the solution, spun at 200 rpm until the surface was smooth, then at 500 rpm for 6 min. The Pyralin was cured at 180° C. for 15 hours. In this state the polyimide absorbed hexyl methyl dichlorosilane. The polyimide was final cured at 400° C. for three hours, leaving the polyimide in a state that did not absorb the silane. The polyimide was imaged with one 54 mJ/cm$^2$ pulse at 248 nm through a one um feature sized chrome on quartz mask. The imaged wafer was flooded with the hexyl methyl dichlorosilane, allowed to stand for eight minutes while being purged with $N_2$, and the excess spun and washed off during spinning with heptane. The wafer was etched in $O_2$ in a Perkin-Elmer Randex reactive ion etcher at a forward power of 100 W for 11 minutes. The one um features of the mask were faithfully reproduced with the laser exposed areas being highly etch resistant. The line walls were vertical with no evidence of significant undercutting.

EXAMPLE 3

A 1:1:1 solution was made from Du Pont Pyralin TM 2545, ethyl acetate, and N-methyl pytrolidinone. This solution was flooded onto a 3 inch diameter bare silicon wafer and spun out at 2000 rpm on a Headway Research Inc. spinner, producing a dry film thickness of 160 nm. The sample was then baked for 15 hours in a 180° C. vacuum oven, and then cured for 3 hours at 400° C. in nitrogen. The so produced semi-crystalline polyimide film was then exposed through a mask to one pulse of 248 nm light from an excimer laser at a fluence of 54 mJ/cm$^2$. The latent amorphous image where the polyimide was exposed to the laser light was developed by flooding the sample with hexylmethyldichlorosilane, waiting 8 minutes, and then rinsing the excess silane off with heptane. The silylated sample was then reactive ion etched for 11.25 minutes in a Randex etcher. The etcher operated with pure oxygen as the etchant at a flow rate of 80 sccm at a power of 0.052 watts/cm$^2$. The etched line profiles shown in FIG. 1, have a line width of 1.3 um and a line width tolerance of less than 0.2 um.

EXAMPLE 4

The same polyimide polymer as in Example 3 was exposed to 35 pulses of excimer laser light at 2 mJ/cm$^2$, and the sample did not form an image on etching. This shows the formation of images in the polymer exhibits a threshold for pulse energy density. This example suggests that image formation is the result of a photothermal process.

EXAMPLE 5

The same polyimide polymer as in Example 3 was reactive ion etched using the Randex etcher, and the etch rate monitored using a Model 60SXR FTIR apparatus from Nicolet Instrument Corp., Madison, Wis., in an infrared reflection-absorption configuration. The etch time was 4 minutes. The etch rate ratio of laser treated (quasi-amorphous) silylated polyimide to non-laser treated (semi-crystalline) silylated polyimide was 1:3.7. The etch ratio of laser treated (quasi-amorphous) silylated polyimide to non-laser treated (semi-crystalline) and unsilylated polyimide was 1:16.

EXAMPLE 6

5.1 grams of nylon 6 (Scientific Polymer Products) was dissolved in 125 ml of o-chlorophenol. Three inch silicon wafers were flooded with this solution and spun out at 4000 rpm, producing a dry film thickness of 156 nm. After the nylon coated wafers were baked in a vacuum oven at 165° C. for 2 hours, the samples were exposed to two pulses of an excimer laser at 193 nm at a fluence of 27 mJ/cm$^2$/pulse. The exposed wafers were then flooded with allylmethyldichlorosilane, and after five minutes, were washed with heptane. The samples were then reactive ion etched as in Example 4 for 14 minutes.

The laser treated and silylated nylon showed no loss of nylon, however, the non-laser treated semi-crystalline silinated nylon lost 53% of the nylon

What is claimed is:

1. A method for forming a resist image on a surface comprising the steps of providing a layer of a semicrystalline polymeric material on a surface, irradiating said surface in an imagewise manner so as to create an imagewise distribution of quasi-amorphous polymer within said layer, applying a liquid or vapor to said layer which is selectively absorbed by the quasi-amorphous polymer, and is more slowly etched by reactive ion etching than the semicrystalline polymer, and then reactive ion etching preferentially removing the semicrystalline polymer.

2. The method of claim 1 wherein said semicrystalline polymer comprises polyethyleneterephthalate.

3. The method of claim 1 wherein said semicrystalline polymer comprises a polyimide.

4. The method of claim 1 wherein said liquid or vapor comprises a silane ester.

5. The method of claim 2 wherein said liquid or vapor comprises a silane ester.

6. The method of claim 3 wherein said liquid or vapor comprises a silane ester.

7. The method of claim 1 wherein said irradiating is performed by an excimer laser.

8. The method of claim 2 wherein said irradiating is performed by an excimer laser.

9. The method of claim 1 wherein said irradiating is performed with ultraviolet radiation.

10. The method of claim 7 wherein said irradiating is performed with ultraviolet radiation.

11. The process of claim 1 wherein said irradiating is performed by a radiation selected from the group consisting of e-beam, x-ray, ion beam, and plasma.

12. The process of claim 2 wherein said irradiating is performed by a radiation selected from the group consisting of e-beam, x-ray, ion beam, and plasma.

13. The process of claim 1 wherein a U.V. absorbing solute is present in said semicrystalline polymer, and after being irradiated and applying said liquid, said layer is flooded with U.V. radiation and then developed with a solvent to dissolve that portion of the polymer not having the liquid or vapor selectively absorbed.

14. The method of claim 1 wherein said vapor or liquid consists essentially of a silane or siloxane.

15. The method of claim 2 wherein said vapor or liquid consists essentially of a silane or siloxane.

16. The method of claim 3 wherein said vapor or liquid consists essentially of a silane or siloxane.

17. The method of claim 4 wherein said vapor or liquid consists essentially of a silane and siloxane.

UNITED STATES PATENT AND TRADEMARK OFFICE
CERTIFICATE OF CORRECTION

PATENT NO. : 5,061,604
DATED : Oct. 29, 1991
INVENTOR(S) : Ouderkirk et al.

It is certified that error appears in the above-identified patent and that said Letters Patent is hereby corrected as shown below:

Col. 6, line 34, Replace "crystalline" with --crystallite--.

Col. 7, line 27, Insert --at-- between "used" and "higher".

Col. 10, line 50, Replace "pytrolidinone" with --pyrrolidinone--.

Signed and Sealed this

Sixth Day of July, 1993

Attest:

MICHAEL K. KIRK

*Attesting Officer*  *Acting Commissioner of Patents and Trademarks*